(12) United States Patent
Kato et al.

(10) Patent No.: US 11,315,854 B2
(45) Date of Patent: Apr. 26, 2022

(54) SEMICONDUCTOR DEVICE AND METHOD OF MANUFACTURING SEMICONDUCTOR DEVICE

(71) Applicants: FUJI ELECTRIC CO., LTD., Kawasaki (JP); FURUKAWA ELECTRIC CO., LTD., Tokyo (JP)

(72) Inventors: Ryoichi Kato, Matsumoto (JP); Hiromichi Gohara, Matsumoto (JP); Yoshinari Ikeda, Matsumoto (JP); Yoshikazu Takahashi, Sendai (JP); Kuniteru Mihara, Tokyo (JP); Isao Takahashi, Tokyo (JP)

(73) Assignees: FUJI ELECTRIC CO., LTD., Kawasaki (JP); FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/997,622

(22) Filed: Aug. 19, 2020

(65) Prior Publication Data
US 2021/0066158 A1     Mar. 4, 2021

(30) Foreign Application Priority Data
Aug. 30, 2019 (JP) .............................. JP2019-158361

(51) Int. Cl.
*H01L 23/06* (2006.01)
*H01L 23/373* (2006.01)
(Continued)

(52) U.S. Cl.
CPC ...... *H01L 23/3735* (2013.01); *H01L 21/4882* (2013.01); *H01L 21/565* (2013.01); *H01L 23/3121* (2013.01); *H01L 24/32* (2013.01); *H01L 24/48* (2013.01); *H01L 24/73* (2013.01); *H01L 25/072* (2013.01); *H01L 2224/32225* (2013.01); *H01L 2224/48137* (2013.01); *H01L 2224/48175* (2013.01); *H01L 2224/73265* (2013.01); *H01L 2924/014* (2013.01); *H01L 2924/0105* (2013.01);
(Continued)

(58) Field of Classification Search
CPC . H01L 23/3121; H01L 23/3735; H01L 24/48; H01L 25/072
USPC ......................................................... 257/703
See application file for complete search history.

(56) References Cited

U.S. PATENT DOCUMENTS 4,942,452 A * 7/1990 Kitano .............. H01L 23/49503
257/666
5,355,283 A * 10/1994 Marrs ................. H01L 23/3128
174/260
(Continued)

FOREIGN PATENT DOCUMENTS

JP       2006-156574   *  6/2006  ............. H01L 21/52
WO       2014098004 A1    6/2014

*Primary Examiner* — Nitin Parekh
(74) *Attorney, Agent, or Firm* — Rabin & Berdo, P.C.

(57) ABSTRACT

A semiconductor device, including a conductive plate having a front surface that includes a plurality of bonding regions and a plurality of non-bonding regions in peripheries of the bonding regions, a plurality of semiconductor elements mounted on the conductive plate in the bonding regions, and a resin encapsulating therein at least the plurality of semiconductor elements and the front surface of the conductive plate. The conductive plate has, at the front surface thereof in the non-bonding regions, a plurality of holes.

12 Claims, 8 Drawing Sheets

(51) Int. Cl.
*H01L 23/31* (2006.01)
*H01L 23/00* (2006.01)
*H01L 25/07* (2006.01)
*H01L 21/56* (2006.01)
*H01L 21/48* (2006.01)

(52) U.S. Cl.
CPC ........... *H01L 2924/01006* (2013.01); *H01L 2924/01013* (2013.01); *H01L 2924/01014* (2013.01); *H01L 2924/01015* (2013.01); *H01L 2924/01023* (2013.01); *H01L 2924/01028* (2013.01); *H01L 2924/01029* (2013.01); *H01L 2924/01032* (2013.01); *H01L 2924/01047* (2013.01); *H01L 2924/01051* (2013.01); *H01L 2924/01079* (2013.01); *H01L 2924/01082* (2013.01); *H01L 2924/01083* (2013.01); *H01L 2924/1033* (2013.01); *H01L 2924/10253* (2013.01); *H01L 2924/10272* (2013.01); *H01L 2924/12032* (2013.01); *H01L 2924/12036* (2013.01); *H01L 2924/13055* (2013.01); *H01L 2924/13091* (2013.01); *H01L 2924/1576* (2013.01); *H01L 2924/15724* (2013.01); *H01L 2924/15738* (2013.01); *H01L 2924/15747* (2013.01); *H01L 2924/15787* (2013.01)

(56) References Cited

U.S. PATENT DOCUMENTS

| 5,557,150 | A | * | 9/1996 | Variot | G03F 7/70433 257/666 |
|---|---|---|---|---|---|
| 2002/0053742 | A1 | * | 5/2002 | Hata | H01L 31/0203 257/774 |
| 2009/0243097 | A1 | * | 10/2009 | Koroku | H01L 23/3114 257/737 |
| 2011/0298121 | A1 | * | 12/2011 | Nishibori | H01L 23/49861 257/713 |
| 2014/0041923 | A1 | * | 2/2014 | Hisada | H05K 3/4602 174/266 |
| 2015/0179553 | A1 | * | 6/2015 | Khor | H01L 21/4821 257/676 |
| 2015/0187671 | A1 | | 7/2015 | Fukuda et al. | |

* cited by examiner

| D1 | D2 | D3 | L | ADHESION |
|---|---|---|---|---|
| 100 | 50 | 100 | 200 | ◎ |
| 80 | 50 | 100 | 200 | ◎ |
| 120 | 50 | 100 | 200 | ◎ |
| 100 | 30 | 100 | 200 | ◎ |
| 100 | 75 | 100 | 200 | ◎ |
| 100 | 50 | 80 | 200 | ◎ |
| 100 | 50 | 120 | 200 | ◎ |
| 100 | 50 | 100 | 300 | ◎ |
| 100 | 50 | 100 | 100 | ◎ |

FIG.7
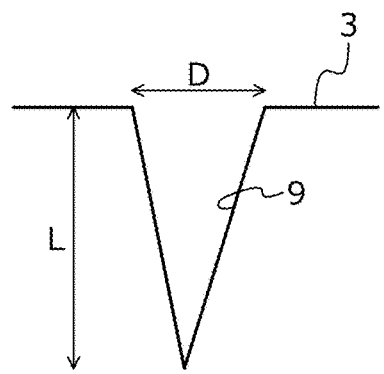
FIG.8
| D | L | ADHESION |
|---|---|---|
| 60 | 200 | ◎ |
| 40 | 200 | ◎ |
| 80 | 200 | ◎ |
| 60 | 100 | ◎ |
| 60 | 300 | ◎ |
FIG.9
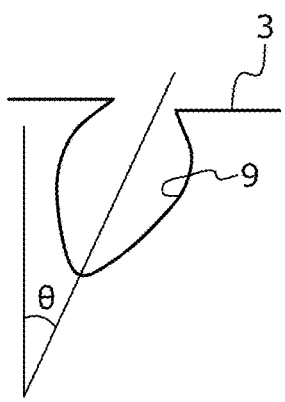

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2019-158361, filed on Aug. 30, 2019, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Recently, with a focus on insulated gate bipolar transistors (IGBTs), power semiconductor modules are widely used in power converting equipment. A power semiconductor module is a power semiconductor device that has one or more power semiconductor chips, configures a part of or all of a conversion connection, and has a structure in which the power semiconductor chip and a base board or a cooling face are electrically insulated from one another.

FIG. 12 is a cross-sectional view of a configuration of a conventional power semiconductor module. As depicted in FIG. 12, a power semiconductor module 150 includes power semiconductor chips 101, an insulating substrate 102, a conductive plate 103, a heat radiating plate 104, metal terminals 105, wires 106, and a molding resin 107 covering (molding) these components.

The power semiconductor chips 101 are power semiconductor chips such as for an IGBT or a diode and are bonded on the conductive plate 103 by a bonding material 108 such as solder. When the conductive plate 103 containing, for example, copper is provided on a front surface of the insulating substrate 102 that is, for example, a ceramic substrate, and at a back surface of the insulating substrate 102, the heat radiating plate 104 containing, for example, copper is provided, this is called a stacked substrate. The stacked substrate is bonded to a cooling device. The wires 106 electrically connect the power semiconductor chips 101 and the metal terminals 105 that carry signals out to an external device. Further, while not depicted, these components are mounted in plural in a single semiconductor device. In general, an epoxy resin is used for the molding resin 107.

In the power semiconductor module 150 of a molding resin type depicted in FIG. 12, adhesion between the epoxy resin that is the molding resin 107 and the metal terminals 105 and/or the conductive plate 103 is not necessarily favorable and therefore, immediately after molding, peeling may occur due to contraction of the epoxy resin (the molding resin 107).

Furthermore, even when peeling due to contraction of the molding resin 107 is avoided immediately after molding, if there are temperature changes in the environment in which the power semiconductor chips 101 is used, peeling may occur due to a difference in the coefficients of thermal expansion between the molding resin 107 and the copper. In the power semiconductor module 150 having a large current capacity, a width of a lead frame implementing the metal terminals 105 increases and peeling appears more prominently.

To prevent peeling, in the conventional power semiconductor module 150, an anchor layer 120 is provided configured by striated recesses formed by laser light irradiation of the conductive plate 103 (for example, refer to International Publication No. WO 2014/098004). FIG. 13 is a plan view of an arrangement of the recesses of the anchor layer of the conventional power semiconductor module. FIG. 14 is a cross-sectional view of a configuration of the recesses of the anchor layer of the conventional power semiconductor module. FIG. 14 is a cross-sectional view of a part along cutting line X-X' in FIG. 13. As depicted in FIGS. 13 and 14, in the anchor layer 120, four striated (linear) recesses 121 are disposed so as to surround the power semiconductor chips 101. Sidewalls of the recesses 121 formed by the laser light irradiation are rough and since frictional force between the molding resin 107 and the recesses 121 is large, the anchoring effect is large, thereby preventing peeling.

SUMMARY OF THE INVENTION

According to an embodiment of the invention, a semiconductor device includes a conductive plate having a front surface that includes a plurality of bonding regions and a plurality of non-bonding regions in peripheries of the bonding regions; a plurality of semiconductor elements mounted on the conductive plate in the bonding regions; and a resin encapsulating therein at least the plurality of semiconductor elements and the front surface of the conductive plate. The conductive plate has, at the front surface thereof in the non-bonding regions, a plurality of holes.

In the embodiment, each of the plurality of holes has a round shape or an elliptical shape in a plan view of the semiconductor device.

In the embodiment, each of the plurality of holes has a V-shape in a cross-sectional view of the semiconductor device.

In the embodiment, each of the plurality of holes has an internal width that is greater than an opening width in a cross-sectional view of the semiconductor device.

In the embodiment, a portion of the conductive plate immediately surrounding each of the plurality of holes is substantially flush with portions of the conductive plate other than said portion.

In the embodiment, a height difference between said portion and each of the portions of the conductive plate other than said portion is less than 10 μm in a cross-sectional view of the semiconductor device.

In the embodiment, each of the plurality of holes has a central axis that is inclined with respect to a direction perpendicular to the front surface of the conductive plate.

In the embodiment, each of the plurality of holes has, at side surfaces thereof, a plurality of protrusions.

In the embodiment, the plurality of holes is formed by laser light irradiation.

According to another embodiment of the invention, a method of manufacturing a semiconductor device includes preparing a conductive plate having a front surface that includes a plurality of bonding regions and a plurality of non-bonding regions in peripheries of the bonding regions, and forming a plurality of holes in the non-bonding regions by irradiating the conductive plate with a laser light; mounting a semiconductor element on the front surface of the conductive plate in the bonding regions; and encapsulating in a resin, at least the semiconductor element and the front surface of the conductive plate.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 7 is a cross-sectional view depicting dimensions of a V-shape of the dot-shaped holes of the conductive plate of the power semiconductor module according to the embodiment.

FIG. 8 is a table of adhesion and dimensions of the V-shape of the dot-shaped holes of the conductive plate of the power semiconductor module according to the embodiment.

FIG. 9 is a cross-sectional view depicting an angle of inclination of the dot-shaped holes of the conductive plate of the power semiconductor module according to the embodiment.

DETAILED DESCRIPTION OF THE INVENTION

Figure 13:
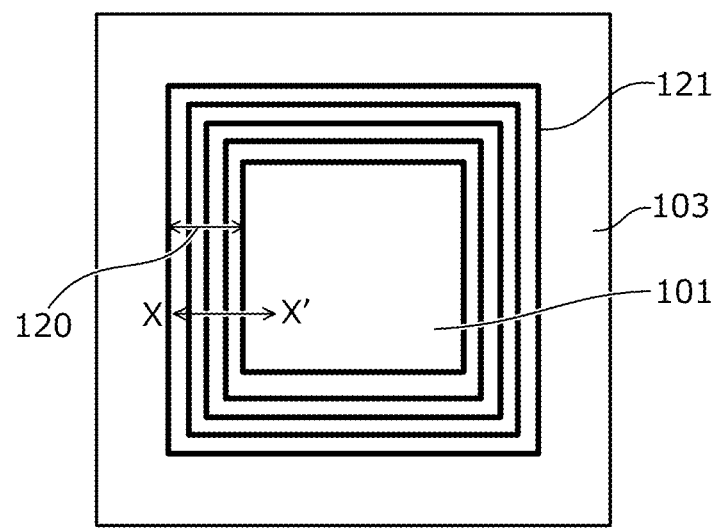
FIG. 13 is a plan view of an arrangement of the recesses of an anchor layer of the conventional power semiconductor module.
Figure 14:
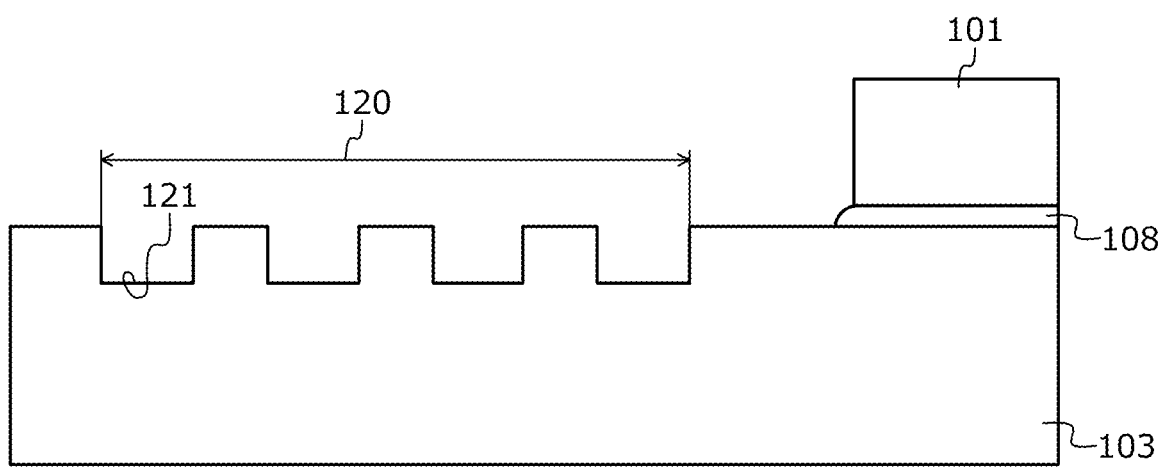
FIG. 14 is a cross-sectional view of a configuration of the recesses of the anchor layer of the conventional power semiconductor module.

First, problems associated with the conventional techniques will be discussed. With the recesses 121 depicted in FIGS. 13 and 14, in some instances, adhesion is insufficient. Furthermore, the anchor layer 120 is only provided surrounding the power semiconductor chips 101 of the conductive plate 103; at parts of the conductive plate 103 where the anchor layer 120 is not provided, adhesion to the molding resin 107 is not improved and at these parts, peeling between the conductive plate 103 and the molding resin 107 may occur.

Figure 1:
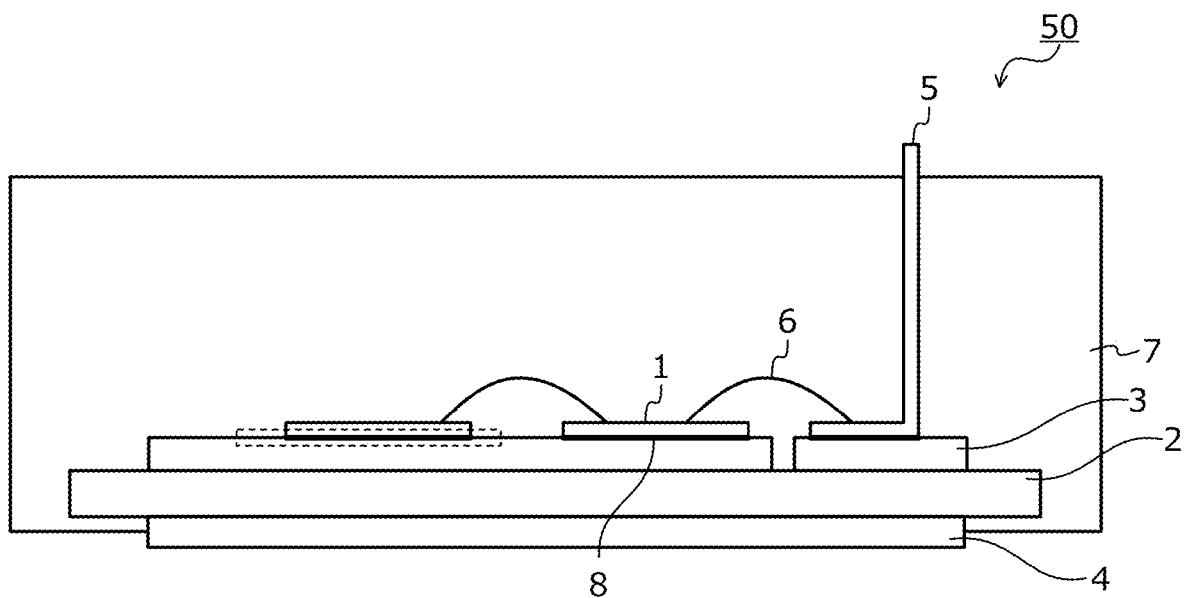
FIG. 1 is a cross-sectional view of a configuration of a power semiconductor module according to an embodiment.

Embodiments of a semiconductor device and a method of manufacturing a semiconductor device according to the present invention will be described in detail with reference to the accompanying drawings. FIG. 1 is a cross-sectional view of a configuration of a power semiconductor module according to an embodiment.

As depicted in FIG. 1, in a power semiconductor module 50, a stacked substrate is configured in which on first and second main surfaces, respectively front and back surfaces, of an insulating substrate 2, a conductive plate 3 containing, for example, copper is disposed on the front surface while a heat radiating plate 4 containing, for example, copper is disposed on the back surface. Multiple power semiconductor chips 1 are mounted on a front surface of the conductive plate 3 of the stacked substrate, via a bonding material 8 such as solder, whereby a stacked assembly is formed. A metal terminal 5 that carries signals out to an external device is bonded on the conductive plate 3 by the bonding material 8. Further, wires 6 electrically connecting the power semiconductor chips 1 and the metal terminal 5 are provided on front surfaces of the power semiconductor chips 1. A molding resin 7 covers at least the surfaces of these components.

The power semiconductor chips (semiconductor elements) 1 contain a material such as silicon (Si), silicon carbide (SiC), gallium nitride (GaN), etc. The power semiconductor chips 1 include a switching element such as an IGBT, a power metal oxide semiconductor field effect transistor (MOSFET), etc. Such power semiconductor chips 1 have, for example, a drain electrode (or, collector electrode) as a main electrode at the back surface and gate electrodes and a source electrode (or an emitter electrode) as a main electrode at the front surface.

Further, as necessary, the power semiconductor chips 1 include a diode such as a Schottky barrier diode (SBD), a free wheeling diode (FWD), etc. Such power semiconductor chips 1 have a cathode electrode as a main electrode at the back surface and an anode electrode as a main electrode at the front surface. The electrodes at the back surfaces of the power semiconductor chips 1 described above are bonded to the front surface of the conductive plate 3 by the bonding material 8.

The stacked substrate includes the insulating substrate 2, the heat radiating plate 4 formed on the back surface of the insulating substrate 2, and the conductive plate 3 formed on the front surface of the insulating substrate 2. The conductive plate 3 is processed into a predetermined shape (pattern) by, for example, etching to connect the power semiconductor chips 1 and the metal terminal 5, etc. The insulating substrate 2 contains a high-thermal-conductive ceramic having favorable thermal conductivity such as aluminum oxide, aluminum nitride, silicon nitride, etc. The insulating substrate 2 has a thickness that may be in a range from 200 μm to 700 μm from a viewpoint of withstand voltage. The heat radiating plate 4 contains a metal having favorable thermal conductivity such as copper (Cu), aluminum (Al), iron (Fe), silver (Ag), or an alloy containing at least one of these. The conductive plate 3 contains a metal having favorable conductivity such as copper, aluminum, or an alloy containing at least one of these and, for example, has a thickness in a range from 400 µm to 1000 µm. When the conductive plate 3 is too thin, dot-shaped holes cannot be formed by a laser process described hereinafter. Surfaces of these metals may have a nickel (Ni) plating film, an electroless nickel (Ni—P (phosphorus)) plating film. By performing plating, oxidation of the copper is reduced, thereby enabling decreases in the adhesion between the conductive plate 3 and the molding resin 7 to be prevented.

As a stacked substrate having such a configuration, for example, a direct copper bonding (DCB) substrate or an active metal blazed (AMB) substrate may be used. Through the conductive plate 3, the insulating substrate 2, and the heat radiating plate 4, the stacked substrate may conduct externally relative to the semiconductor device, heat generated by the power semiconductor chips 1. Further, the stacked substrate may be metal base substrate. The metal base substrate has a configuration in which an insulating layer containing a resin is stacked on the heat radiating plate 4 containing a metal such as aluminum, copper, etc. and thereon, the conductive plate 3 is further stacked. In the conductive plate 3, dot-shaped holes are formed by laser light at the surface to improve adhesion with the molding resin 7. The conductive plate 3 will be described in detail hereinafter.

The conductive plate 3 is sealed by the molding resin 7. As a sealing material, a silicone resin or the like may be used when a case is used. However, when the molding resin 7 has a function of a case, a thermosetting resin, an epoxy resin, a phenolic resin, a polyimide resin, a polyamide resin, a polyamide-imide resin, a maleimide resin may be used. An adhesion aid may be used. Further, the molding resin 7 may contain, as an inorganic filler, for example, a microfiller or a nanofiller of inorganic particles such as silica, alumina, boron nitride, aluminum nitride, etc. to increase the linear expansion coefficient and induce thermal conductivity. Adhesion between the molding resin 7 and the conductive plate 3 may decrease due to thermal stress from a power cycle test or a heat cycle test. This mainly occurs in instances where the material of the molding resin 7 has high rigidity and particularly occurs in instances of a molding resin that contains a filler and for which Young's modulus is in a range from 3000 N/mm$^2$ to 30000 N/mm$^2$ and the coefficient of thermal expansion is in a range from 3000×10$^{-6}$/K to 25000×10$^{-6}$/K. Thus, this molding resin 7 is provided in the conductive plate having the dot-shaped holes formed by laser light of the present invention, whereby adhesion may be particularly improved. This is particularly effective for the molding resin 7 when Young's modulus thereof is in a range from 5000 N/mm$^2$ to 20000 N/mm$^2$ and the coefficient of thermal expansion thereof is in a range from 3000×10$^{-6}$/K to 25000×10$^{-6}$/K.

Further, when the filler is too large, the filler cannot enter the dot-shaped holes and adhesion decreases, thus, a filler having a particle size that is smaller than a diameter of the dot-shaped holes may be contained at a larger amount than a filler having a particle size that is larger than the particle size of the dot-shaped holes. In particular, the filler particle size may advantageously have an average particle size in a range from 20 µm to 60 µm. More advantageously, filler having a particle size of 5 µm to 10 µm may be contained at 10% to 20%. Most advantageously, a shape of the filler may be that a spherical filler or a crushed filler, the average particle size may be about 10 µm, and a filler having a particle size in a range from 2.5 µm to 10 µm may be contained at 50% to 70%.

The bonding material 8 is used for bonding between components of the power semiconductor module 50 and, for example, is solder. For the solder, for example, a tin-silver (Sn—Ag) based, a tin-antimony (Sn—Sb) based, or a tin-copper (Sn—Cu) based solder may be used. In FIG. 1, while the wires 6 are used to electrically connect the power semiconductor chips 1 and the conductive plate 3, a lead frame may be used to electrically connect the power semiconductor chips 1 and the conductive plate 3. In this case, to improve adhesion between the lead frame and the molding resin 7, similarly to the conductive plate 3, dot-shaped holes formed by laser may be further provided in the lead frame. Other than the lead frame, the dot-shaped holes may be further provided by laser in a printed circuit board. Here, a conductive plate of a predetermined thickness may advantageously be provided.

A first end of each of the wires 6 is bonded to a top surface (surface of each of the power semiconductor chips 1, opposite to a surface thereof in contact with the conductive plate 3) of each of the power semiconductor chips 1, as wiring for electrical connection. A second end of each of the wires 6 is bonded to the metal terminal 5 (or the conductive plate 3 to which the metal terminal 5 is fixed) or to another one of the power semiconductor chips 1. In FIG. 1, while the wires 6 are used to electrically connect the power semiconductor chips 1 and the conductive plate 3, the lead frame may be used for the connection.

The power semiconductor module of the embodiment is manufactured as described below. In a method of manufacture, first, the stacked substrate is prepared in which the conductive plate 3 is provided on the front surface of the insulating substrate 2 and the heat radiating plate 4 is provided on the back surface. Next, the front surface of the conductive plate 3 is irradiated with a laser light, thereby forming dot-shaped holes. Control parameters for the laser light and the laser will be described hereinafter.

Next, the power semiconductor chips 1 are mounted to the front surface of the conductive plate 3 provided in the stacked substrate. In particular, the bonding material 8 and the power semiconductor chips 1 are stacked and bonded on the conductive plate 3, and the bonding material 8 and the metal terminal 5 are stacked and bonded on the conductive plate 3, whereby a stacked assembly formed by the power semiconductor chips 1, the stacked substrate, and the heat radiating plate 4 is assembled. For the bonding material 8, a solder material, a bonding material having metal microparticles, etc. is used. For the solder material that is melted and forms a solder bonding layer, a solder material having tin (Sn) as a main constituent and containing silver (Ag) and/or antimony (Sb) and/or copper (Cu) may be used. In addition to these constituents, a solder material containing at least one constituent selected from among nickel (Ni), germanium (Ge), Si, vanadium (V), phosphorus (P), bismuth (Bi), gold (Au), lead (Pb), aluminum (Al), carbon (C) may be used. A solder material called a lead-free solder, having Sn as a main constituent and at most 500 ppm of Pb, contains numerous constituents such as a binary eutectic material or a ternary eutectic material like Sn—Ag or Sn—Ag—Cu, Sn—Sb, Sn—Sb—Ag, etc. A bar-shaped preformed material (solder bar) or a solder paste that is powdered and combined with a flux may be used as a solder material.

When a solder material is used as the bonding material 8, preferably the dot-shaped holes formed by laser are not formed at sites (bonding regions) where the power semiconductor chips 1 are bonded to the conductive plate 3. At the regions of the conductive plate 3 where the holes formed by laser are disposed, wettability of the solder material is poor. Therefore, voids would occur at bonding parts, bond strength would decrease, and thermal resistance would increase. Accordingly, the dot-shaped holes formed by laser may formed at regions other than the bonding parts (i.e., the non-bonding regions).

Next, the stacked body including the power semiconductor chips 1 and the metal terminal 5, the conductive plate 3, and the bonding material 8 is heated, the bonding material 8 is melted, thereby electrically connecting the power semiconductor chips 1 and the metal terminal 5 to the conductive plate 3. Next, the power semiconductor chips 1 and the metal terminal 5 are electrically connected by the wires 6.

Next, power semiconductor circuit components such as the stacked substrate on which the power semiconductor chips 1 are mounted are disposed inside a mold for resin molding and the mold is filled with the molding resin 7 that is a hard resin such as an epoxy. Molding of the molding resin 7 may be by transfer molding or injection molding. Thus, the power semiconductor module 50 according to the embodiment and depicted in FIG. 1 is completed. A case may be disposed on a cooling device and inside the case, the power semiconductor circuit components such as the stacked substrate on which the power semiconductor chips 1 are mounted may be disposed, and the case may be filled with a sealing material. In this instance, the structure is such that the cooling device and the sealing material are in contact with one another. Therefore, at the surface of the cooling device in contact with the sealing material, the dot-shaped holes formed by laser of the present invention may be provided. The cooling device includes a metal cooling plate.

Figure 2:
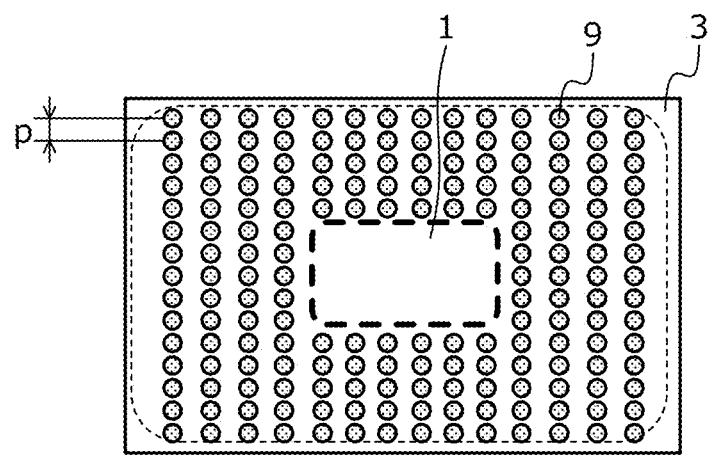
FIG. 2 is a plan view of a portion of a conductive plate surrounded by a dashed line in FIG. 1.

Hereinafter, the conductive plate 3 will be described in detail. FIG. 2 is a plan view of a portion of the conductive plate surrounded by a dashed line in FIG. 1. As depicted in FIG. 2, in the conductive plate 3 according to the embodiment, multiple dot-shaped holes 9 are provided at peripheries of regions where the power semiconductor chips 1 are bonded. The dot-shaped holes 9 have a planar shape that is substantially circular or substantially elliptical. A pitch p of the dot-shaped holes 9 may be in a range from 150 µm to 500 µm. Further details are described hereinafter. The pitch p is a distance from a center of one of the dot-shaped holes 9 to a center of an adjacent dot-shaped hole of the dot-shaped holes 9.

Here, the pitch p of the dot-shaped holes 9 is described. The pitch p may be in a range from 100 µm to 1000 µm or more advantageously, may be in a range from 150 µm to 500 µm. Expressed another way, assuming a diameter of the dot-shaped holes 9 is D, the pitch p may be in a range from D+20 µm to D+1000 µm or more advantageously, may be in a range from D+50 µm to D+500. When the pitch p is too narrow, walls between the dot-shaped holes 9 become thin, strength becomes insufficient, and adhesion decreases, whereas when too wide, the anchor effect does not occur sufficiently. While D varies depending on the shape of the dot-shaped holes 9, in instances of the shapes depicted in FIGS. 3A and 3C described hereinafter, a diameter W of a widest width is assumed.

While holes can be formed in the conductive plate 3 by etching, pressing, etc., holes having the shape according to the present invention are impossible to form. Therefore, in the embodiment, the dot-shaped holes 9 are formed by laser light irradiation. For the laser, a fiber laser that is a type of solid-state laser and composed of a medium and a resonator that amplify light may be used. A fiber laser has an extremely small focal point compared to an yttrium aluminum garnet (YAG) laser and a carbon dioxide ($CO_2$) laser and therefore, enables fine holes to be formed by applying heat to and melting pinpoints in copper or aluminum. Further, the laser is irradiated intermittently as a pulse wave. The "dot-shape" is a substantially circular or substantially elliptical planar shape of a single hole and the holes are formed to be separate from one another, not continuous.

For example, a Furukawa FEC1000S single mode fiber laser may be used as the fiber laser. The dot-shaped holes 9 are formed in a predetermined shape and therefore, control parameters such as the fiber laser having an oscillation wavelength of 1.070 µm, power being in a range from 800 W to 1200 W, an irradiation time being in a range from 0.005 seconds to 0.04 seconds, energy being in a range from 4 J to 40 J, a spot diameter being in range from 30 µm to 60 µm, and energy density being in a range from 0.0014 J/µm$^2$ to 0.014 J/µm$^2$ may be set. More advantageously, control parameters such the fiber laser having an oscillation wavelength of 1.070 µm, the power being in a range from 900 W to 1000 W, the irradiation time being in a range from 0.008 seconds to 0.02 seconds, energy is in a range from 7.2 J to 20 J, the spot diameter being in a range from 45 µm to 55 µm, and the energy density being in a range from 0.003 J/µm$^2$ to 0.013 J/µm$^2$ may be set.

Further, configuration may be such that a single hole is formed by a single pulse. While a single region may be irradiated by multiple times with a pulse wave, melted material accumulates in the holes and variation the shape of the holes occurs. While the oscillation wavelength, the power, the irradiation time, the energy, the spot diameter, etc. are effective as parameters for controlling the shape of the holes, the energy density, which is the energy of the laser per unit area, is the most effective for shape control. When the energy density is below than the range described, melted material may form raised parts near the openings of the holes and hole depth may vary. Further, when the energy density is too high, melting and evaporation become unstable, and variation of the hole shape increases.

As a processing agent, a metal such as copper or aluminum or an alloy containing at least one of these is advantageous in forming the shape of the holes. The predetermined control parameters of the laser facilitate formation of the predetermined shape and minimize variation of the shape. Further, at surfaces of these metals (base material), a nickel (Ni) plating film, an electroless nickel (Ni—P (phosphorus)) plating film may be formed. At the surfaces of the metals, while oxide films are formed, film thickness and film quality are not uniform depending on the environment. On the other hand, when a plating film of a predetermined film thickness is formed, formation of the oxide film is hindered and thus, is further advantageous in making the shape of the holes uniform. To form holes having a uniform shape, the film thickness of the plating film may be in a range from 1 µm to 15 µm. However, when the film thickness of the plate film is too thick, variation of the shape of the holes may increase. Therefore, for more uniform shapes, the range may be from 1.5 µm to 4 µm. The base material and the plating film of differing melting points are stacked and therefore, when the plating film is too thick, variation of the shape of the holes increases.

Further, the dot-shaped holes 9 are formed by irradiating a single region with the laser light under the control parameters above, with an angle in a range from 7 degrees to 23 degrees, 1 to 2 times or more advantageously, 1 time. The laser light is irradiated from an angle because without angling the laser light, holes formed by irradiating the laser light orthogonal to the conductive plate 3 are too thin (small) for the molding resin 7 enter the holes. Further, even when the molding resin 7 enters the holes, the molding resin 7 in the holes is of a small amount and thin and thus, of insufficient strength, particularly when subjected to shearing forces.

Here, for the focus of the laser light, while any of one of inner-focus (under-focus) when the focal point is in the conductive plate 3, outer-focus (overfocus) when the focal point is higher than the surface of the conductive plate 3, and just-focus when the focal point is at the surface of the conductive plate 3 may be used, inner-focus is the most advantageous. In the case of inner-focus, the focal point may be at a depth in a range from about 300 μm to 900 μm from the surface of the conductive plate 3 or more advantageously, in a range from 500 μm to 800 μm. The spot diameter of the laser light at the surface of the conductive plate 3 in this case is in the range 30 μm to 60 μm described above. Use of inner-focus for the focus reduces variation in the shape of the dot-shaped holes 9. Further, due to deviation of focal point from the surface of the conductive plate 3, convergence of the energy degrades slightly, notches easily occur at side surfaces of the dot-shaped holes 9, and adhesion between the conductive plate 3 and the molding resin 7 improves (refer to FIG. 10).

Further, the laser light, for example, may be set to have a pulse frequency (pulse interval) of 1000 Hz and a feed rate for the conductive plate 3 may be set to about 100 mm/s to form the dot-shaped holes 9. Further, the pulse frequency (pulse interval) may be set to 500 Hz and the feed rate for the conductive plate 3 may be set to about 50 mm/s. By these parameters, the pitch of the dot-shaped holes 9 is determined and as depicted in FIG. 2, the dot-shaped holes 9 are provided with regularity in a vertical direction and a horizontal direction at the pitch p of about 100 μm.

In this manner, the dot-shaped holes 9 are provided at the surface of the conductive plate 3, whereby the contact area between the molding resin 7 and the conductive plate 3 increases and the molding resin 7 in the dot-shaped holes 9 works as an anchor, thereby improving the adhesion between the molding resin 7 and the conductive plate 3. Furthermore, the dot-shaped holes 9 are provided so as to surround peripheries of the power semiconductor chips 1 and therefore, may prevent solder that is the bonding material 8 from spreading around. Further, to improve the adhesion between the solder and the molding resin 7 that is an epoxy resin, etc., configuration may be such that the solder intervenes only at bonding parts between the power semiconductor chips 1 and the conductive plate 3, and the area of contact between the solder and the molding resin 7 is small. In particular, in the regions in which the holes are provided in a dotted-pattern, the wettability of the solder is poor, and in the regions where the holes are provided in a dotted-pattern other than bonding areas, wetting and spreading of the solder is hindered. As a result, the area of contact between the solder and the molding resin 7 may be minimized. Further, peeling of the conductive plate 3 and the molding resin 7 may be prevented, improving reliability of the power semiconductor module.

Figure 3A:
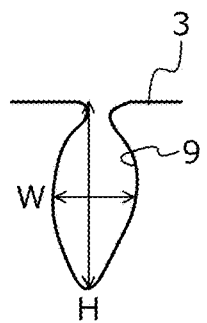
FIG. 3A is a cross-sectional view of a shape of the dot-shaped holes of the conductive plate of the power semiconductor module according to the embodiment.
Figure 3B:
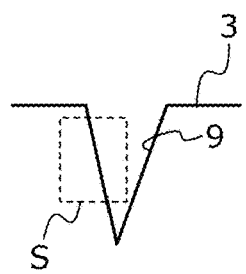
FIG. 3B is a cross-sectional view of a shape of the dot-shaped holes of the conductive plate of the power semiconductor module according to the embodiment.
Figure 3C:
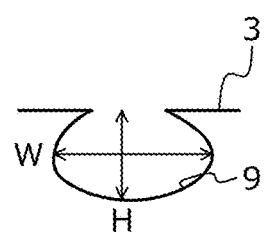
FIG. 3C is a cross-sectional view of a shape of the dot-shaped holes of the conductive plate of the power semiconductor module according to the embodiment.
Figure 3D:
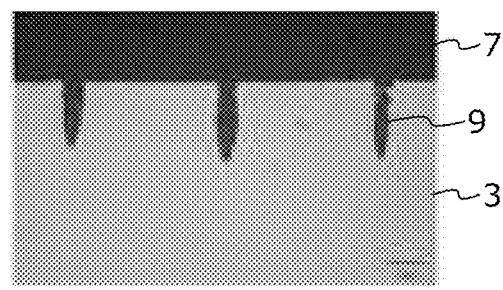
FIG. 3D is a photograph showing the shape of the dot-shaped holes of the conductive plate of the power semiconductor module according to the embodiment.
Figure 3E:
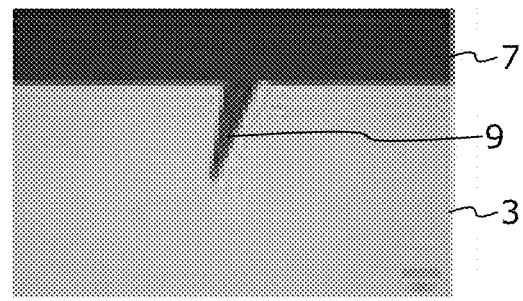
FIG. 3E is a photograph showing the shape of the dot-shaped holes of the conductive plate of the power semiconductor module according to the embodiment.

Next, an advantageous cross-sectional shape of the dot-shaped holes 9 will be described. FIGS. 3A, 3B, and FIG. 3C are cross-sectional views of shapes of the dot-shaped holes of the conductive plate of the power semiconductor module according to the embodiment. FIGS. 3D and 3E are photographs showing the shape of the dot-shaped holes of the conductive plate of the power semiconductor module according to the embodiment. FIG. 3D is a photograph of the shape in FIG. 3A; FIG. 3E is a photograph of the shape in FIG. 3B.

Figures 5, 6:
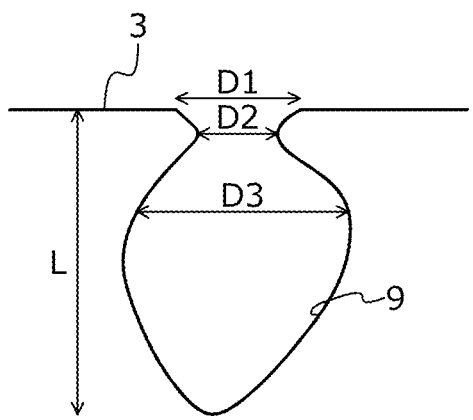
FIG. 5 is a cross-sectional view depicting dimensions of a bulging shape of the dot-shaped holes of the conductive plate of the power semiconductor module according to the embodiment.
FIG. 6 is a table of adhesion and dimensions of bulging shapes of the dot-shaped holes of the conductive plate of the power semiconductor module according to the embodiment.

FIGS. 3A and 3C each shows a shape that bulges in a middle thereof, in other words, a shape (cross-sectional shape) in which an internal width of the dot-shaped hole 9 is greater than a width of an opening of the dot-shaped hole 9. FIG. 3A depicts an instance in which a depth H of the dot-shaped hole 9 is greater than a width W of the dot-shaped hole 9 (H>W), FIG. 3C depicts an instance of a squat shape in which the width W of the dot-shaped hole 9 is at least equal to the depth H of the dot-shaped hole 9 (W≥H). Further, in FIG. 3B, the dot-shaped hole 9 has a V-shape (cross-sectional shape) in which the width progressively decreases from the surface in a direction of depth. Further, as depicted in FIG. 3A, the shape may have a constricted part near the opening of the dot-shaped hole 9. This constricted part, as depicted in FIG. 5, may have a diameter D2 that is smaller than a diameter D1 of the opening. In a cross-sectional view, the constricted part is between the opening and part where an inner diameter is greatest. The dot-shaped holes 9 may be formed to have a shape that bulges in the middle or a V-shape by adjusting the control parameters of the laser.

Below, when adhesion was tested by a pudding cup test indicating details, for each of the shapes of the holes, adhesion improved to a greater extent than in an instance in which the dot-shaped holes 9 were not provided. Among these, FIG. 3B had the best adhesion followed by FIG. 3A, FIG. 3C in descending order of adhesion. In particular, for FIG. 3A, adhesion improved at least 75% compared to the instance in which the dot-shaped holes 9 are not provided; for FIG. 3B, adhesion improved at least 100% compared to the instance in which the dot-shaped holes 9 are not provided; for FIG. 3C, adhesion improved at least 50% compared to the instance in which the dot-shaped holes 9 are not provided. In the case of W≥H in FIG. 3C, the molding resin 7 did not easily enter the dot-shaped holes 9 and therefore, improvement of the adhesion was lower than that for FIGS. 3A and 3B.

Figure 4A:
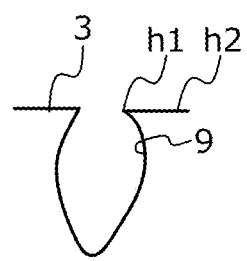
FIG. 4A depicts a flat shape without a raised part at an opening of the dot-shaped holes.
Figure 4B:
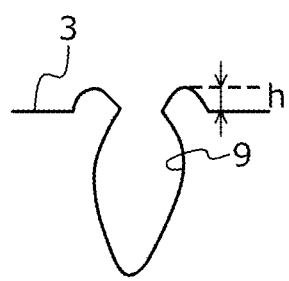
FIG. 4B depicts a shape in which the raised part is formed at the opening of the dot-shaped holes.

FIGS. 4A and 4B are cross-sectional views of shapes of the openings of the dot-shaped holes of the conductive plate of the power semiconductor module according to the embodiment. FIG. 4A depicts a flat shape without a raised part at the opening of the dot-shaped hole 9. The raised part is a part that is higher than the front surface of the conductive plate 3 at the opening of the dot-shaped holes 9 and in particular, this is an instance in which a height h1 of the raised part of the opening of the dot-shaped hole 9 from the conductive plate 3 is less than 10 μm. FIG. 4B depicts a shape in which the raised part is formed at the opening of the dot-shaped hole 9. In particular, this is an instance in which a height h of the raised part of the opening of the dot-shaped hole 9 from the conductive plate 3 is at least 10 μm. Assuming a height of a flat part separate from the raised part is h2, h may be expressed as h1−h2.

Below, when adhesion was tested by a pudding cup test indicating details, for FIG. 4A, adhesion improved at least 75% compared to the instance in which the dot-shaped holes 9 are not provided; for FIG. 4B, adhesion improved about 40% compared to the instance in which the dot-shaped holes 9 are not provided, but was lower compared to the shape in which the opening is flat. This is because the raised part is metal that was melted by the laser light and that again hardened and therefore, adhesion with the conductive plate 3 is low and the raised part easily peels. Here, while the instance of FIG. 3A in which the shape that bulges in the middle is depicted, that same occurs with the V-shape in FIG. 3B. In other words, when the height h of the raised part is at least 10 μm, adhesion does not sufficiently improve.

FIG. 5 is a schematic diagram of a shape that bulges in the middle, in other words, a shape that has an internal width that is greater than the width of the opening of the dot-shaped hole 9 and that has a constricted part near the opening, FIG. 5 being a cross-sectional view depicting dimensions of the bulging shape of the dot-shaped holes of the conductive plate of the power semiconductor module according to the embodiment. In FIG. 5, D1 is a diameter of the opening of the dot-shaped hole 9, D2 is a diameter of a part that is narrowest of the dot-shaped hole 9, and D3 is a diameter of a part that is widest of the dot-shaped holes 9. Further, L is a depth of the dot-shaped hole 9.

FIG. 6 is a table of adhesion and dimensions of bulging shapes of the dot-shaped holes of the conductive plate of the power semiconductor module according to the embodiment. In FIG. 6, instances in which the adhesion improved at least 75% compared to the instance in which the dot-shaped holes 9 were not provided are indicated by ⊚. As depicted in FIG. 6, the diameter D1 may be within a range from 80 μm to 120 μm and more advantageously, may be within a range from 90 μm to 110 μm. Further, the diameter D2 may be within a range from 30 μm to 70 μm and more advantageously, may be within a range from 40 μm to 60 μm. Further, the diameter D3 may be within a range from 80 μm to 120 μm and more advantageously, may be within a range from 90 μm to 110 μm. Further, the length L may be within a range from 100 μm to 300 μm and more advantageously, may be within a range from 150 μm to 250 μm.

In particular, when the shape of the dot-shaped holes 9 has a constricted part, in other words, in an instance of D2<D1 and D2<D3, D2/L may be in a range from 30/300 to 70/100, i.e., a range from 0.1 to 0.7.

FIG. 7 is a cross-sectional view depicting dimensions of the V-shape of the dot-shaped holes of the conductive plate of the power semiconductor module according to the embodiment. In FIG. 7, D is the diameter of the opening of the dot-shaped holes 9 and L is the depth of the dot-shaped holes 9.

FIG. 8 is a table of adhesion and dimensions of the V-shape of the dot-shaped holes of the conductive plate of the power semiconductor module according to the embodiment. In FIG. 8, instances in which the adhesion improved at least 100% compared to the instance in which the dot-shaped holes 9 are not provided are indicated by @. As depicted in FIG. 8, the diameter D may be in a range from 40 μm to 80 μm and more advantageously, may be in a range from 50 μm to 70 μm. Further, the length L may be in a range from 100 μm to 300 μm and more advantageously, may be in a range from 150 μm to 250 μm.

The shape of the dot-shaped holes 9 may be longer than it is wide, that is, D<L is advantageous. Therefore, D/L may be in a range from 40/300 to 80/100, i.e., a range from 0.13 to 0.8 and more advantageously, may be within a range from 50/250 to 70/150, i.e., a range from 0.2 to 0.47. In this manner, the shape and the dimensions thereof of the dot-shaped holes 9 are within advantageous ranges improving adhesion.

FIG. 9 is a cross-sectional view depicting an angle of inclination of the dot-shaped holes of the conductive plate of the power semiconductor module according to the embodiment. The dot-shaped holes 9 have insufficient adhesion with the molding resin 7 when formed in a direction orthogonal to the surface of the conductive plate 3. Therefore, the dot-shaped holes 9 may be inclined so that a central axis of the dot-shaped holes 9 is inclined with respect to an orthogonal direction. The central axis of each of the dot-shaped holes 9 is an axis connecting a center of the opening of the dot-shaped hole 9 and a center of a bottom of the dot-shaped hole 9. In other words, the central axis of the dot-shaped holes 9 forms an angle θ with a perpendicular to the surface of the conductive plate 3. This inclination angle θ may be within a range from about 7 degrees to 23 degrees. Further, the direction of incline of the dot-shaped holes 9 may be inclined in a direction in which the molding resin 7 is injected. This facilitates entry of the molding resin 7 into the dot-shaped holes 9.

The dot-shaped holes 9 having the inclination angle θ as such may be formed by setting an incident angle of the laser light to be the inclination angle θ. Further, herein, while the instance of FIG. 3A in which the shape bulges in the middle is depicted, the same occurs with the V-shape depicted in FIG. 3B.

Figure 10:
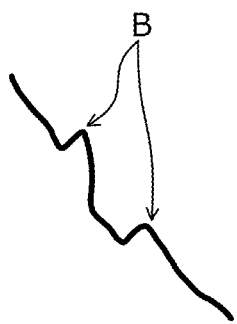
FIG. 10 is a cross-sectional view depicting protrusions of the dot-shaped holes of the conductive plate of the power semiconductor module according to the embodiment.

FIG. 10 is a cross-sectional view depicting protrusions of the dot-shaped holes of the conductive plate of the power semiconductor module according to the embodiment. FIG. 10 is an enlarged view of a part of a region S in FIG. 3B. In the embodiment, the dot-shaped holes 9 may have protrusions B at side surfaces thereof. Here, the dot-shaped holes 9 are formed by irradiation of laser light. In the laser light irradiation, once metal (for example, copper) is melted and dispersed, thereafter the remaining metal hardens, whereby the protrusions B are formed. The protrusions B increase surface roughness, thereby strengthening the anchor effect and further improving adhesion. When the dot-shaped holes 9 are formed by etching or pressing, the protrusions B are not formed and therefore, in the embodiment, the dot-shaped holes 9 are formed by the laser light irradiation. A height of the protrusions B may be in a range from 2 μm to 10 μm.

An instance of formation of the dot-shaped holes 9 of the present invention and an instance in which linear grooves each having a groove width of 100 μm and a groove interval of 100 μm were formed in parallel were compared. While the linear grooves were formed by irradiating pulsed laser so that holes were connected, forming a continuous groove shape, the linear grooves may be formed by scanning while continuously irradiated laser. In the case of the linear grooves, it was found that adhesion is not sufficiently improved. In particular, adhesion improved by about 30% compared to the instance in which the dot-shaped holes 9 are not provided. This is the adhesive strength at which peeling occurs in an instance of a power semiconductor module. Improvement of at least 40% is advantageous and improvement of at least 50% further advantageous. This result was the same in the instance of the cross-sectional shape that bulges in the middle and in the instance of the V-shape. In the instance of the linear grooves, it is conceivable that the anchor effect is not exerted sufficiently with respect to a direction parallel to the line direction and therefore, the adhesion degrades. Such an instance of linear grooves is not desirable because adhesion differs in a direction orthogonal to a direction parallel to the line direction and therefore, the arrangement, direction, etc. of the linear grooves has to be individually designed depending on the chip pattern and/or shape of the module, and even with such measures, regions where adhesion is poor still occur.

Figure 11:
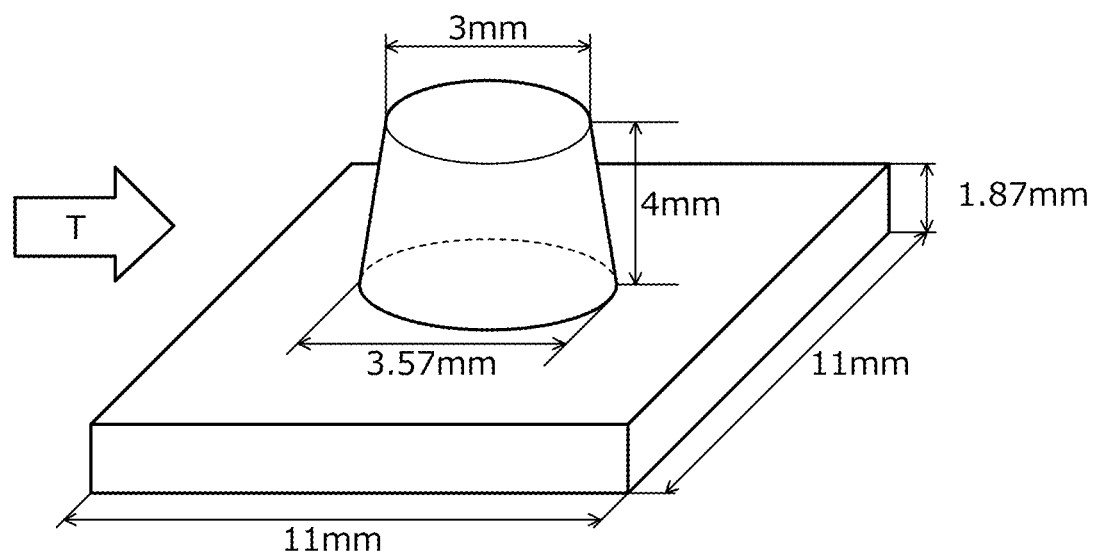
FIG. 11 is a perspective view of a pudding cup test of the power semiconductor module according to the embodiment.
Figure 12:
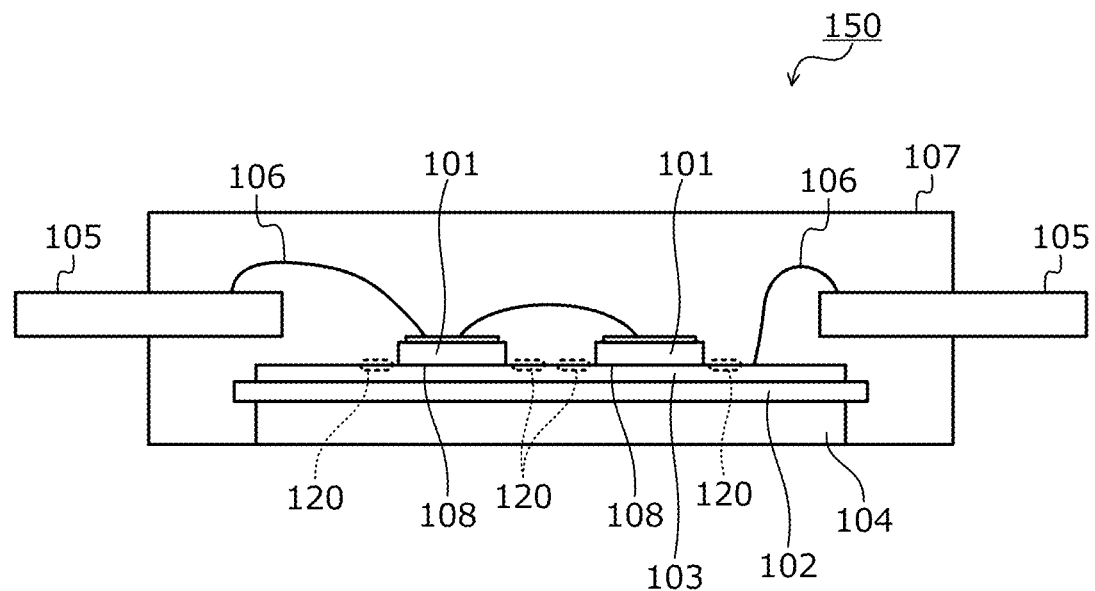
FIG. 12 is a cross-sectional view of a configuration of a conventional power semiconductor module.

FIG. 11 is a perspective view of a pudding cup test of the power semiconductor module according to the embodiment. A pudding cup test is a test in which resin molded in a pudding mold is bonded on a plate; the resin is pushed by a certain force in a horizontal direction, for example, a direction indicated by arrow T in FIG. 11; and the force (adhesive strength) applied until the resin is removed is measured, indicating adhesion between the molding resin and the conductive plate. Adhesion may be indicated by adhesive strength and by adhesive strength per unit area. The greater is the measured force, the higher is adhesion.

In the embodiment, the test was performed using the conductive plate 3 made of copper and having a thickness of 1.87 mm and a length and width of 11 mm for the plate, and using the molding resin 7 having a lower diameter of 3.57 mm, an upper diameter of 3 mm, and a height of 4 mm for the resin. The conductive plate 3 was bonded on the insulating substrate 2 containing silicon nitride and having a thickness of 0.32 mm and on the back surface of the insulating substrate 2, a plate similar to the conductive plate 3 was used as the heat radiating plate 4. Further, an epoxy resin was used for the molding resin. Silica was used for the filler.

In the pudding cup test for the instance in which the dot-shaped holes 9 are not provided in the conductive plate, the force until the resin was removed was 100. In this case, in the pudding cup test for the instance in which linear grooves are provided in parallel on the conductive plate, the force applied until the resin was removed was 135 and in the pudding cup test for the instance in which, in the conductive plate 3 of the embodiment, the dot-shaped holes 9 are provided each having a shape that bulges in the middle, the force applied until the resin was removed was at least 175. In other words, adhesion improved at least 75%. Furthermore, in the pudding cup test for the instance in which, in the conductive plate 3 of the embodiment, the dot-shaped holes 9 were each provided having the V-shape, the force applied until the resin was removed was at least 200. In other words, adhesion improved at least 100%.

As described above, according to the semiconductor device and the method of manufacturing a semiconductor device according to the embodiment, the conductive plate has multiple dot-shaped holes formed by laser light irradiation. As a result, adhesion between the conductive plate and the molding resin improves. Therefore, peeling of the conductive plate and the molding resin may be prevented, thereby improving reliability of the power semiconductor module. In the embodiment, while an epoxy resin is used, similar effects were obtained with other resins (polyimide resin, etc.).

In the foregoing, without limitation to the embodiments, the present invention may be variously modified within a range not departing from the spirit of the invention. For example, the present invention is further applicable to a semiconductor device in which a stacked assembly is assembled in a case and the case is filled with a resin. In this instance as well, adhesion between the resin and the conductive plate may be improved.

According to the invention described above, the conductive plate has multiple dot-shaped holes formed by laser light irradiation. As a result, adhesion between the conductive plate and the molding resin improves. Therefore, peeling of the conductive plate and the molding resin may be prevented, thereby improving reliability of the power semiconductor module.

The semiconductor device and the method of manufacturing a semiconductor device according to the present invention achieve an effect in that adhesion between the conductive plate and the resin is increased, enabling peeling to be prevented.

As described above, the semiconductor device and the method of manufacturing a semiconductor device according to the present invention are useful for power semiconductor devices used in power converting equipment such as inverters, power supply devices such as those in various industrial machines, and inverters, etc. of automobiles.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a conductive plate having a front surface that includes a plurality of bonding regions and a plurality of non-bonding regions in peripheries of the bonding regions;
   a plurality of semiconductor elements mounted on the conductive plate in the bonding regions; and
   a resin encapsulating therein at least the plurality of semiconductor elements and the front surface of the conductive plate, wherein
   the conductive plate has, at the front surface thereof in the non-bonding regions, a plurality of holes,
   each of the plurality of holes has a round shape or an elliptical shape in a plan view of the semiconductor device, and the resin contains a first filler having a particle size smaller than a diameter of the plurality of holes, and a second filler having the particle size larger than the diameter of the plurality of holes, the first filler being of a larger amount than the second filler.

2. The semiconductor device according to claim 1, wherein
   each of the plurality of holes has a V-shape in a cross-sectional view of the semiconductor device.

3. The semiconductor device according to claim 1, wherein
   each of the plurality of holes has an internal width that is greater than an opening width in a cross-sectional view of the semiconductor device.

4. The semiconductor device according to claim 1, wherein
   a portion of the conductive plate immediately surrounding each of the plurality of holes is substantially flush with portions of the conductive plate other than said portion.

5. The semiconductor device according to claim 4, wherein
   a height difference between said portion and each of the portions of the conductive plate other than said portion is less than 10 µm in a cross-sectional view of the semiconductor device.

6. The semiconductor device according to claim 1, wherein
   each of the plurality of holes has a central axis that is inclined with respect to a direction perpendicular to the front surface of the conductive plate.

7. The semiconductor device according to claim 1, wherein
   each of the plurality of holes has, at side surfaces thereof, a plurality of protrusions.

8. The semiconductor device according to claim 1, wherein the plurality of holes is formed by laser light irradiation.

9. The semiconductor device according to claim 1, wherein
   each of the plurality of holes has a constricted part that has a diameter smaller than a diameter of an opening of the hole, and that is located between the opening and a part where an inner diameter of the hole is greatest in a cross-sectional view of the semiconductor device.

10. The semiconductor device according to claim 1, wherein a pitch of the plurality of holes, which is a distance between centers of adjacent two of the plurality of holes, is greater than a diameter of the plurality of holes by 20 μm to 1000 μm.

11. The semiconductor device according to claim 1, wherein
a pitch of the plurality of holes, which is a distance between centers of adjacent two of the plurality of holes, is in a range from 150 μm to 500 μm.

12. A method of manufacturing a semiconductor device, the method comprising:
preparing a conductive plate having a front surface that includes a plurality of bonding regions and a plurality of non-bonding regions in peripheries of the bonding regions, and forming a plurality of holes in the non-bonding regions by irradiating the conductive plate with a laser light, each of the plurality of holes being of a round shape or an elliptical shape in a plan view of the semiconductor device;
mounting a plurality of semiconductor elements on the front surface of the conductive plate in the bonding regions; and
encapsulating in a resin, at least the plurality of semiconductor elements and the front surface of the conductive plate, wherein the resin contains a first filler having a particle size smaller than a diameter of the plurality of holes, and a second filler having the particle size larger than the diameter of the plurality of holes, the first filler being of a larger amount than the second filler.

* * * * *